(12) United States Patent
Bae et al.

(10) Patent No.: US 8,372,504 B2
(45) Date of Patent: Feb. 12, 2013

(54) TRANSPARENT COMPOSITE COMPOUND

(75) Inventors: Byeong-Soo Bae, Daejeon (KR); Jungho Jin, Daejeon (KR); Seung Cheol Yang, Daejeon (KR); Ji Hoon Ko, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 16 days.

(21) Appl. No.: 12/617,357

(22) Filed: Nov. 12, 2009

(65) Prior Publication Data

US 2010/0178478 A1 Jul. 15, 2010

(30) Foreign Application Priority Data

Jan. 13, 2009 (KR) .................. 10-2009-0002687
Nov. 4, 2009 (KR) .................. 10-2009-0105759

(51) Int. Cl.
*B32B 9/04* (2006.01)

(52) U.S. Cl. .......... 428/96; 428/375; 428/396; 428/429; 428/447; 442/180; 106/287.12; 106/287.13; 106/287.16; 106/287.19

(58) Field of Classification Search ............. 106/287.12, 106/287.13, 287.16, 287.19; 442/180; 428/96, 428/375, 396, 429, 447
See application file for complete search history.

(56) References Cited

U.S. PATENT DOCUMENTS

| | | | | |
|---|---|---|---|---|
| 5,668,237 A * | 9/1997 | Popall et al. | .................. | 528/9 |
| 5,800,926 A * | 9/1998 | Nogami et al. | .................. | 428/447 |
| 6,743,517 B2 * | 6/2004 | Nakamura et al. | .................. | 428/447 |
| 6,808,812 B2 * | 10/2004 | White et al. | .................. | 428/447 |
| 7,119,140 B2 * | 10/2006 | Basham et al. | .................. | 524/494 |
| 7,348,393 B2 * | 3/2008 | Frohlich et al. | .................. | 528/32 |
| 7,960,192 B2 * | 6/2011 | Thompson et al. | .................. | 438/22 |
| 2005/0215677 A1 * | 9/2005 | Gaggar et al. | .................. | 524/115 |
| 2010/0019399 A1 * | 1/2010 | Kimura et al. | .................. | 257/791 |
| 2010/0104827 A1 * | 4/2010 | Yorisue | .................. | 428/195.1 |

FOREIGN PATENT DOCUMENTS

| | | |
|---|---|---|
| JP | 54-24933 | 2/1979 |
| JP | 1993-140376 | 6/1993 |
| JP | 05140367 A | 6/1993 |
| JP | 1994-094523 | 4/1994 |
| JP | 1994-337408 | 12/1994 |
| JP | 09501964 A | 2/1997 |
| JP | 1999-236407 | 3/2001 |
| JP | 2004109768 A | 4/2004 |
| JP | 2005-285778 | 10/2005 |
| JP | 2005-285779 | 10/2005 |
| JP | 2005-285780 | 10/2005 |
| JP | 2005298800 A | 10/2005 |
| JP | 2007091962 A | 4/2007 |
| KR | 10-2005-0098086 | 10/2005 |
| KR | 10-2005-0099849 | 10/2005 |
| WO | WO 2007/018756 | * 2/2007 |
| WO | WO 2009/051453 | * 4/2009 |

OTHER PUBLICATIONS

JP2004109768 (A); Apr. 8, 2004, Ricoh KK, English Abstract, 1 page.
JP2005298800 (A); Oct. 27, 2005, Korea Advanced Inst of Sci Technol, English Abstract, 1 page.
JP09501964 (A); Feb. 25, 1997; Siemens Aktiengesellschaft, English Abstract in Corresponding Publication International Publication No. 9506050A1, 1 page.
JP2007091962 (A); Apr. 12, 2007, Asahi Kasei Chemicals Corp, Asahi Kasei Corp, English Abstract, 1 page.
JP05140367 (A); Jun. 8, 1993, Japan Synthetic Rubber Co Ltd., English Abstract, 1 page.
Korean Office Action—Korean Application No. 10-2009-0105759 issued on Apr. 20, 2012, citing US5,668,237.

* cited by examiner

*Primary Examiner* — Marc Zimmer
(74) *Attorney, Agent, or Firm* — Cantor Colburn LLP

(57) ABSTRACT

Provided is a non-hydrolytic transparent composite composition having excellent transparency and heat resistance, and a low thermal expansion coefficient. Particularly, the transparent composite composition includes a glass filler dispersed in a crosslinked transparent resin produced by a non-hydrolytic reaction. The non-hydrolytic transparent siloxane resin is a resin having Si—O (siloxane) bonds, a resin having at least one kind of heterometal bonds, including Si—O bonds, or the resin further containing other ingredients. When the transparent siloxane resin produced by a non-hydrolytic reaction forms a composite in combination with the glass filler, the composite realizes high transparency and heat resistance, as well as a low thermal expansion coefficient. Therefore, the transparent composite composition is useful as a substrate for thin film transistor (TFT) devices, display devices and optical devices.

7 Claims, No Drawings

TRANSPARENT COMPOSITE COMPOUND

The present invention claims priority of Korean Patent Application No. 10-2009-0002687, filed on 13 Jan. 2009 and 10-2009-0105759 filed on 4 Nov. 2009 which is incorporated herein by reference.

BACKGROUND OF THE INVENTION

1. Field of the Invention

The present invention relates to a non-hydrolytic transparent composite composition having excellent transparency and heat resistance and a low thermal expansion coefficient.

2. Description of Related Art

In general, glass plates have been used as a thin film transistor (TFT) substrate for liquid crystal display (LCD) or organic electroluminescent (EL) display device, color filter substrate, touch screen panel substrate, solar cell substrate, or the like. However, since glass plate is not flexible, is fragile and is heavy, it is not suitable for providing low-weight devices. Recently, due to such shortcomings, many studies have been conducted about plastic substrates including optical polymers or various composite resin materials as materials substituting for glass substrates.

Polymers used in the above-mentioned plastic substrates include polyethylene terephthalate (PET), polyether sulfone (PES), polyethylene naphthalate (PEN), polyarylate (PAR), polycarbonate (PC), polyimide (PI), etc. However, such conventional plastic materials have a severe shortcoming in that they have a high thermal expansion coefficient. While glass generally has a thermal expansion coefficient of approximately several ppm/° C., the plastics have a relatively high thermal expansion coefficient of at least several tens [of] ppm/° C. The problem related with such a high thermal expansion coefficient may cause degradation of dimensional stability during the fabrication of a device, such as TFT. Moreover, because most plastic materials specifically show a rapid change in thermal expansion coefficient before and after the glass transition temperatures, they cause problems, such as bending or disconnection, during the fabrication of a device. Such problems result in an additional problem in that plastic substrates are used within a limited range of process temperatures, and thus the device is fabricated at a reduced temperature.

In the case of a PI substrate having a relatively low thermal expansion coefficient and a high glass transition temperature, PI has [a] very low transparency as determined by a light transmission of 30-60%, and shows a high birefringence, and thus is not suitable for a substrate material substituting for glass.

More recently, many studies have been conducted to develop composite resins that solve the above problems of plastic materials.

Particularly, such composite resin compositions include: a composition including a cycloaliphatic epoxy resin, an acid anhydride curing agent and a curing catalyst as disclosed in Japanese Laid-Open Patent No. Hei6-337408; a composition including an cycloaliphatic epoxy resin, a carboxylic [acid group-containing] acid anhydride curing agent and a curing catalyst as disclosed in Japanese Laid-Open Patent No. 200159015; a composition including a styrene-methacrylate copolymer as disclosed in Japanese Laid-Open Patent No. Sho54-24933; a composition including an acrylic resin and a styrene-acrylonitrile copolymer as disclosed in Japanese Published Patent No. Hei6-94523; a composition including an N-substituted maleimide-olefin copolymer as disclosed in Japanese Laid-Open Patent No. Hei5-140367; or the like.

However, substrates using such existing composite resins may cause degradation of transparency due to a yellowing phenomenon and have difficulties in adjusting the refractive index of the resin to the refractive index of the glass filler. In addition, the substrates still have a high thermal expansion coefficient to provide [reliable] dimensional stability and show insufficient heat resistance. Therefore, substrate materials that may substitute for glass preferably have a low thermal expansion coefficient, excellent optical transparency and heat resistance, and more preferably have no glass transition behavior in a range of temperatures where a device is fabricated.

More recently, in addition to the above-mentioned conventional plastic materials and composite resins, siloxane-based organic resins have been studied as materials for display and optical devices. For example, Japanese Laid-Open Patent Nos. 2005-285778, 2005-285779 and 2005-285780 disclose a composition including a silicone resin and glass cross. In addition, Japanese Laid-Open Patent No. 2004-109768 discloses a resin composition including a hydrolytic condensation product between metal alkoxides. However, such compositions are insufficient for providing substrates satisfying mechanical properties, transparency and flexibility at the same time.

Further, although there is no clear factor found to date, hydrolytic condensation using water and a solvent for carrying out condensation of a silicone resin still have problems in that it causes poor resin stability due to a trace amount of water remaining after the crosslinking of the resin, and it results in the shrinking of the resin due to the use of a solvent.

As materials capable of solving the above-mentioned problems, Korean Laid-Open Patent Nos. 10-0614976 and 10-0569220 disclose compositions including organic/inorganic hybrid oligomers having a functional organic group on the outside thereof. Such compositions are obtained by non-hydrolytic condensation with no water added during the condensation. The nanohybrid polymers obtained using such compositions alone have flexibility, light transmission, wear resistance, heat resistance and insulation property. However, such polymers still have a high thermal expansion coefficient and limited mechanical strength. Therefore, they are not suitable as substrate materials substituting for the existing glass plate.

SUMMARY OF THE INVENTION

The present invention has been made in view of the above problems, and an embodiment of the present invention is directed to providing a transparent composite that has a low thermal expansion coefficient, shows no glass transition behavior, and exhibits excellent transparency and heat resistance.

In addition, another embodiment of the present invention is directed to providing a substrate for thin film transistor (TFT) devices, display devices or optical devices, including liquid crystal displays (LCDs), organic electroluminescent (EL) display devices, color filters, touch screen panels, solar cells, transparent panels, optical lenses, light waveguides, or the like, wherein the substrate uses the above-mentioned transparent composite composition and maintains the above-mentioned characteristics.

To achieve the object of the present invention, the present invention provides a transparent composite composition including a transparent siloxane resin having a crosslinkable functional group, and a glass filler, wherein the transparent siloxane resin is produced by non-hydrolytic condensation of a mixture containing at least two of metal alkoxide, organoalkoxysilane and organosilanediol.

As used herein, the expression 'transparent siloxane resin having a crosslinkable functional group and produced by non-hydrolytic condensation' refers to a polysiloxane resin produced in the absence of water. We have found that when the crosslinkable polysiloxane is produced in such a non-hydrolytic manner, the resin shows excellent physical properties, including improved heat resistance, high light transmission and a reasonable thermal expansion coefficient. The present invention is based on this finding. Although the reason why the non-hydrolytic resin has such effects is not clear, the non-hydrolytic resin realizes excellent physical properties as compared to other resins produced via a process including hydrolysis using water.

The present invention also provides a more improved transparent composite composition including a transparent siloxane resin having a crosslinkable functional group, a glass filler and a "reactive additive" capable of reacting with the transparent siloxane resin.

DESCRIPTION OF SPECIFIC EMBODIMENTS

The advantages, features and aspects of the invention will become apparent from the following description of the embodiments, which is set forth hereinafter.

The present invention provides a transparent composite composition including a transparent siloxane resin having a crosslinkable reactive group and produced by non-hydrolytic condensation, and a glass filler, wherein the glass filler is impregnated with or dispersed in the transparent siloxane resin.

Particularly, the present invention provides a transparent composite composition, wherein the transparent siloxane resin having a crosslinkable reactive group and produced by non-hydrolytic condensation is at least one resin selected from the group consisting of: (a) a resin having Si—O (siloxane) bonds, or (b) a resin having Si—O bonds and a resin having at least one kind of heterometal bonds, including Si—O (siloxane) bonds; and (c) the above resins including a reactive additive further reacted therewith.

More particularly, the present invention provides a transparent composite composition, wherein the transparent siloxane resin having a crosslinkable reactive group and produced by non-hydrolytic condensation is at least one resin selected from the group consisting of: (a) a non-hydrolytic condensation product of reactants containing organoalkoxysilane and organosilanediol; (b) a non-hydrolytic condensation product of reactants containing a mixture of organoalkoxysilane with metal alkoxide, and organosilanediol; and (c) a non-hydrolytic condensation product of reactants containing the above reactants and a reactive additive.

In addition, the present invention provides a transparent composite composition including a transparent siloxane resin having a crosslinkable reactive group and produced by non-hydrolytic condensation, and a glass filler, wherein the glass filler is preferably used in an amount of 30-80 wt % based on 100 wt % of the transparent siloxane resin, although there is no particular limitation in the mixing ratio of the transparent siloxane resin with the glass filler.

In addition, the present invention provides a transparent composite obtained by the crosslinking of the transparent siloxane resin after the glass filler is impregnated with or dispersed in the transparent siloxane resin of any one of the transparent composite compositions. In other words, the present invention provides a transparent composite obtained by crosslinking of the transparent composite composition.

In addition, the present invention provides a transparent composite having a thickness of 10-500 µm, a transmission of 70-100% to visible light with a wavelength of 550 nm, a thermal expansion coefficient of 40 ppm/° C. or less in a temperature range of 30-200° C., and a difference in refractive indexes of 0.01 or less between the siloxane resin and the glass filler. Preferably, the present invention provides a transparent composite having a thickness of 50-200 µm, a transmission of 80-100% to visible light with a wavelength of 550 nm, a thermal expansion coefficient of 30 ppm/° C. or less in a temperature range of 30-200° C., and a difference in refractive indexes of 0.01 or less between the siloxane resin and the glass filler. More preferably, the present invention provides a transparent composite having a thermal expansion coefficient of 1-20 ppm/° C. or less in a temperature range of 30-200° C., and a difference in refractive indexes of 0.0001-0.01 between the siloxane resin and the glass filler.

Further, the present invention provides the above transparent composite composition, to which a thermal curing catalyst or photocuring catalyst is further added to perform the crosslinking of the transparent siloxane resin.

According to one embodiment, the transparent composite composition includes a transparent siloxane resin and a glass filler, wherein the glass filler is impregnated with or dispersed in the transparent siloxane resin. The transparent siloxane resin has a refractive index similar or equal to the refractive index of the glass filler to allow easy adjustment of the refractive index, thereby providing a transparent composite with high transparency, and excellent optical properties and heat resistance.

As used herein, the transparent siloxane resin refers to a polysiloxane resin having a crosslinkable group in the presence of photocatalysts, heat or electron beams, or a copolymer thereof.

As used herein, the crosslinkable polysiloxane resin is one obtained by a process including no hydrolysis, and particular examples of the crosslinkable polysiloxane resin include at least one selected from (meth)acryl-substituted polydimethylsiloxane (PDMS), vinyl-substituted PDMS, epoxy-substituted PDMS, and copolymers containing the above polysiloxane structures. The polysiloxane resin is characterized in that it is produced by non-hydrolytic condensation. A crosslinkable polysiloxane resin obtained by a process including hydrolytic condensation does not have sufficient physical properties in terms of thermal shrinkage. On the contrary, although the reason is not clear, when used to fabricate a substrate in combination with glass fibers and/or reactive monomers, the non-hydrolytically condensed crosslinkable polysiloxane allows fabrication of a substrate having excellent physical properties, including transparency and thermal shrinkage, as well as excellent mechanical properties.

In other words, the transparent polysiloxane resin used in the present invention is the non-hydrolytic condensation product as described above and may include: (a) a resin having Si—O (siloxane) bonds; (b) a resin having at least one kind of heterometal bonds, including Si—O (siloxane) bonds; or (c) a composite resin including the above resin (a) or (b) and further containing a reactive additive.

Herein, the reactive additive refers to a monomer having vinyl groups, (meth)acryl groups or allyl groups reactive with unsaturated groups in the case of a transparent resin substituted with unsaturated groups. On the other hand, in the case of epoxy group-containing transparent resins, the reactive additive refers to a compound, such as anhydride or diol, reactive with the resins. It is possible to provide sufficient transparency while imparting flexibility and satisfying mechanical properties by adopting such reactive additives.

There is no particular limitation in the glass filler that may be used in the present invention, as long as the glass filler contributes to such a low thermal expansion coefficient of the resultant transparent composite. Particular examples of the glass filler include glass cross, glass fibers, glass particles, etc.

Hereinafter, particular embodiments of the non-hydrolytically condensed polysiloxane resin that may be used in the present invention will be described, but the scope of the present invention is not limited thereto.

In one embodiment, the transparent siloxane resin produced by non-hydrolytic condensation may include a resin produced by non-hydrolytic condensation and selected from the group consisting of: (a) a resin having Si—O (siloxane) bonds, or (b) a resin having at least two kinds of heterometal bonds, including Si—O (siloxane) bonds, and combinations thereof, or a resin including a resin having Si—O (siloxane) bonds and blends thereof, and containing at least one heterometal bond besides Si—O bonds, and combinations thereof.

The transparent siloxane resin used herein refers to component (a), (b) or (c) that has a refractive index similar or equal to the refractive index of the glass filler.

Referring to component (c), it broadly includes component (a), component (b), or a combination thereof further containing an additive, such as an acrylic resin, methacrylic resin, epoxy rein or other reactive ingredients added thereto in order to adjust the refractive index of the resin, to increase the heat resistance and to reduce the thermal expansion coefficient.

Herein, the term 'heterometal' in the expression of heterometal bond means a trivalent to pentavalent metal, such as titanium (Ti), zirconium (Zr), tin (Sn), germanium (Ge), tantalum (Ta) or aluminum (Al), besides silicon (Si).

In another embodiment, resin (a) having Si—O (siloxane) bonds may include an organic resin obtained by non-hydrolytic condensation of at least one organosilane. Particular examples of such resins include polysiloxane resins having crosslinkable reactive functional groups and obtained from organosilane monomers. Particular examples of the organosilane monomers may include, but are not limited to: 3-glycidyloxypropyltrimethoxysilane, 3-glycidoxypropyltriethoxysilane, 2-(3,4-epoxycyclohexyl)ethyl trimethoxysilane, 2-(3,4-epoxycyclohexyl)ethyltriethoxysilane, methyltrimethoxysilane, methyltriethoxysilane, methyl tripropoxysilane, propylethyltrimethoxysilane, ethyltriethoxy silane, vinyltrimethoxysilane, vinyltriethoxysilane, vinyltripropoxysilane, phenyltrimethoxysilane, diphenylsilanediol, diisobutylsilanediol, N-(3-acryloxy-2-hydroxypropyl)-3-aminopropyltriethoxysilane, N-(3-acryloxy-2-hydroxypropyl)-3-aminopropyltrimethoxysilane, N-(3-acryloxy-2-hydroxypropyl)-3-aminopropyltripropoxysilane, 3-acryloxypropylmethylbis(trimethoxy)silane, 3-acryloxypropyl trimethoxysilane, 3-acryloxypropylriethoxysilane, 3-acryloxy propyltripropoxysilane, 3-(meth)acryloxypropyltrimethoxysilane, 3-(meth)acryloxypropyltriethoxysilane, 3-(meth)acryloxy propyltripropoxysilane, N-(aminoethyl-3-aminopropyl)trimethoxy silane, N-(2-aminoethyl-3-aminopropyl)triethoxysilane, 3-aminopropyltrimethoxysilane, 3-aminoprpyltriethoxysilane, chloropropyltrimethoxysilane, chloropropyltriethoxysilane, heptadecafluorodecyltrimethoxysilane or a combination thereof.

In addition, resin (b) having Si—O (siloxane) bonds and containing at least one heterometal bond may include an organic resin having reactive crosslinkable functional groups therein and obtained by condensation of a mixture containing at least one of the above-listed organosilane compounds and an organometal compound. The organosilane compounds include the above-listed organosilane compounds. In addition, particular examples of the organometal compound may include, but are not limited to: tetraethyl orthosilicate, tetramethyl orthosilicate, tetrapropyl orthosilicate, metal alkoxides, such as aluminum triethoxide, aluminum tripropoxide, aluminum tributoxide, titanium tetraethoxide, titanium butoxide, tin tetraethoxide, tin tetrapropoxide or tin tetrabutoxide, or complexes of the metal alkoxides with diketone or ketoester, and combinations thereof.

There is no particular limitation in the molecular weight of the transparent siloxane resin obtained in this manner, as long as the siloxane resin maintains high transparency, and the substituents present in the resultant resin at least partially have crosslinkable reactive functional groups as described hereinabove. In other words, the substituents present in the transparent siloxane resin at least partially have functional groups capable of addition polymerization or condensation polymerization. The transparent siloxane resin will be described hereinafter in more detail with reference to the functional groups.

There is no particular limitation in the structure of the transparent siloxane resins used in the present invention. The transparent siloxane resins may have various structures, including linear, cyclic, branched or interpenetrating polymer network (IPN) structures.

Meanwhile, the transparent siloxane resin preferably includes resin (a) or resin (b), to which other ingredients, such as (meth)acrylic monomers, epoxy monomers, fumed silica sol, colloidal silica, etc. are added as reactive additives, so as to satisfy the transparency, flexibility and mechanical properties at the same time.

The reactive additives function to adjust the refractive index of the resin to the refractive index of the glass filler, to realize a transparent composite, to increase the heat resistance and to reduce the thermal expansion coefficient of the resin, and cause no degradation of the heat resistance of the resultant transparent composite.

There is no particular limitation in the use of the reactive additives. The additives may be used in any forms of reactive monomers, reactive oligomers and reactive polymers. Particular examples of such additives include: (meth)acrylic monomers, including ethylene glycol diacrylate, ethylene glycol dimethacrylate, 1,4-butanediol diacrylate, 1,6-hexanediol diacrylate, 2-phenoxyethyl acrylate, urethane acrylate, bisphenol A ethoxylate diacrylate, pentaerythritol tetraacrylate, trimethylolpropyl triacrylate, polyethyleneglycol diacrylate, pentabromobenzyl acrylate, pentabromobenzyl methacrylate, pentabrophenyl acrylate, pentabromophenyl methacrylate, zirconium acrylate, 2,4,6-tribromophenyl methacrylate, poly(2,4,6-tribromophenyl methacrylate, poly (1-naphthyl methacrylate), 2,2,3,3,3-pentafluoropropyl acrylate, 2,2,3,4,4,4-hexafluorobutylacrylate, poly(1,1,1,3,3,3-hexafluoroisopropyl acrylate), etc.; epoxy monomers, including epoxy group-containing hydrogenated biphenyl type alicyclic epoxy resins, oxetanyl group-containing epoxy resins, etc.; and curing agents, including acid anhydride-based curing agents, etc.

As mentioned above, the transparent siloxane resin component produced by non-hydrolytic condensation contains functional groups capable of addition polymerization or condensation polymerization. Curing or crosslinking of the functional groups may be performed via thermal polymerization or photopolymerization. In other words, when the functional group is an acryl, methacryl, vinyl, epoxy, amino or hydroxy group and curing and crosslinking of the functional group is based on photopolymerization, the above-mentioned additives may be used in combination with the resin. In this case, particular examples of the photocuring catalyst that may be used herein include arylsulfonium hexafluoroantimonium salt, 2,2-dimethoxy-2-phenylacetophenoene, benzoyl peroxide, dicumyl peroxide, benzoyl peroxide, 2,2-azobis-(2-methylpropionitrile), etc. In addition, when the functional group is one crosslinked or cured via thermal polymerization, particular examples of the thermal curing catalyst that may be used herein include amine-, imidazole- and phosphorus-based catalysts, aluminum acetylacetonate (Alacac), or the like. Particular examples of the amine-, imidazole- and phosphorus-based compounds as thermal curing agents include benzyl dimethyl amine, 1-methylimidazole, 2-phenylimidazole, triphenyl phosphine, triphenyl phosphate, trioctylphosphine oxide, tri-tert-butyl phosphine, tert-butyl phosphonium methane sulfonate, or the like.

The transparent siloxane resin used in the present invention may further include a solvent, if desired, to control the viscosity or stability, as long as the solvent does not adversely affect the transparency and heat resistant of the resultant composite. Particular examples of the solvent that may be used herein include: aliphatic hydrocarbon solvents, such as hexane or heptane; ketone solvents, such as methyl isobutyl ketone, 1-methyl-2-pyrrolidinone, cyclohexanone or acetone; ether solvents, such as tetrahydrofuran, isopropyl ether or propyleneglycol propyl ether; acetate solvents, such as ethyl acetate, butyl acetate, propyleneglycol methyl ether acetate; alcohol solvents, such as isopropyl alcohol or butyl alcohol; amide solvents, such as dimethylacetamide or dimethylformamide; silicone solvents; or mixtures thereof.

In order to ensure excellent transparency, the transparent siloxane resin preferably has a refractive index different from the refractive index of the glass filler by 0.01 or less, preferably 0.001-0.005. When the difference in refractive index is greater than 0.01, the resultant transparent composite tends to show degraded transparency. The glass filler used in the present invention preferably has a refractive index of 1.45-1.56 so that the transparent composite realizes high transparency.

Adjusting the refractive index of the transparent siloxane resin to the refractive index of the glass filler may include, but is not limited to adjusting the refractive index of (a) a resin having Si—O (siloxane) bonds, or (b) a resin having Si—O (siloxane) bonds and containing at least one heterometal bond to the refractive index of the glass filler, for example, by modifying the substituents (e.g. phenyl groups) of the resin component.

In addition, it is desirable to add reactive additives to resin (a) or resin (b) in order to adjust the refractive index of the resin to the refractive index of the glass filler, to increase the heat resistance or to reduce the thermal expansion coefficient, wherein the reactive additives may include high-refractive and low-refractive acrylic or methacrylic monomers, such as pentabromobenzyl acrylate, pentabromobenzyl methacryate, 2,2,3,3,3-pentafluoropropyl acrylate, 2,2,3,4,4,4-hexafluorobutyl acrylate, or the like.

Meanwhile, particular examples of the glass filler used in the present invention include: glass cross or glass fabric, nonwoven glass fabric, glass mesh, glass beads, glass powder, glass flake, chopped glass, milled glass, fumed silica sol, colloidal silica, and combinations thereof. Among such glass fillers, glass cross or glass fabric is most preferred since it significantly reduces the thermal expansion coefficient of the resultant composite. Additionally, the glass filler may be surface treated with a silane coupling agent, etc., in order to increase the adhesion to the transparent siloxane resin and to improve the transparency. Particular examples of the silane coupling agent include acrylsilane, methacrylsilane, vinylsilane, styrylsilane, epoxysilane, aminosilane, or the like.

Further, preferred examples of the glass used herein include E glass, C glass, A glass, S glass, D glass, T glass, NE glass, quartz, low-dielectric and high-dielectric glass, or the like. Among those, E glass, S glass and T glass are preferred since they contain a small amount of ionic impurities.

There is no particular limitation in the method for forming the transparent composite composition produced by non-hydrolytic condensation according to the present invention. Particular examples of such methods include: a method including mixing a non-cured transparent siloxane resin with a glass filler, molding the mixture into a desired shape, and carrying out crosslinking to obtain a sheet; a method including dissolving a non-cured resin into a solvent, dispersing a glass filler therein, molding the resultant dispersion, and carrying out crosslinking to obtain a sheet; or the like. Preferably, glass cross or glass fabric is impregnated with a non-cured resin, followed by crosslinking to obtain a sheet.

When the transparent composite composition according to one embodiment of the present invention is applied to display or optical devices, particularly as a liquid crystal display (LCD) substrate, color filter substrate, organic electroluminescent (EL) display device substrate, solar cell substrate, touch screen panel substrate, etc., the transparent composite is preferably provided in the form of a sheet having a thickness of 50-200 µm, more preferably 50-100 µm.

In addition, when fabricating such devices, the transparent composite composition according to one embodiment of the present invention preferably has a thermal expansion coefficient of 40 ppm/° C. or less, more preferably 1-20 ppm/° C. at a temperature of 30-200° C. Referring to the transparency, when the transparent composite composition is used as a substrate for display devices, it is required for the transparent composite to have a transmission of 80-100%, preferably 85-100%, to light with a wavelength of 550 nm. When the transparent composite has a transmission less than 80% to light with a wavelength of 550 nm, the display device tends to show insufficient display characteristics.

Therefore, the transparent composite according to one embodiment of the present invention may be applied to a variety of thin film transistor (TFT) devices, display devices or optical devices, but is not limited thereto.

The plastic substrate obtained from the transparent composite composition according to the present invention, including a transparent siloxane resin produced by non-hydrolytic condensation, a glass filler and/or a reactive additive, has an easily controllable refractive index, high transparency, low thermal expansion coefficient and excellent heat resistance.

Further, the transparent composite obtained by crosslinking the transparent siloxane resin, glass filler and/or reactive additive of the transparent composite composition according to the present invention may be applied to a variety of TFT devices, display devices or optical devices.

Hereinafter, the embodiments of the present invention will be described in detail with reference to examples and tests. However, the following examples are for illustrative purposes only and not intended to limit the scope of this disclosure.

Example 1

To a 200 mL flask, 3-methacryloxypropyl trimethoxysilane (MPTMS, Aldrich) and diphenylsilanediol (DPSD) are introduced at a molar ratio of 2:3. Next, barium hydroxide as a catalyst is added thereto in an amount of 0.1 mol % based on the silane, and the reaction mixture is allowed to react under agitation at 80° C. for 4 hours to obtain a non-hydrolytically condensed resin whose siloxane bond-containing component has methacryl groups and phenyl groups. The resin is determined to have a weight average molecular weight (MW) of 1290 g/mol as measured by gel permeation chromatography (GPC). Then, 1,6-hexanediol diacrylate is added to the resultant resin in an amount of 20% based on the resin, and 2,2-dimethoxy-2-phenylacetophenone (BDK, Aldrich) is added thereto as a photocuring catalyst in an amount of 2 wt % based on the resin. After that, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

Comparative Example 1

To 37.25 g of 3-methacryloxypropyl trimethoxysilane (MPTMS, Aldrich), 4 g of 0.1 N hydrochloric acid (HCl) solution is added for the purpose of catalysis and hydrolysis. Next, 100 wt % of propyleneglycol methyl ether acetate (PGMEA, Aldrich) is further added thereto based on the weight of MPTS as a solvent to perform a uniform reaction. The reaction mixture is introduced into a 200 mL flask and agitated at 80° C. for 48 hours under reflux to obtain a resin having methacryl groups. The resultant solution is treated by a reduced pressure evaporator under −0.1 MPa at 65° C. for 30 minutes to remove methanol and water remaining in the resin. To the resultant resin, a glass filler and 1,6-hexanediol diacrylate are added in an amount of 20 wt % based on the weight of the resin, and 2,2-dimethoxy-2-phenylacetophenone (BDK, Aldrich) is further added thereto as a photocuring catalyst in an amount of 2 wt % based on the weight of the resin. After that, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

Example 2

To a 200 mL flask, 3-methacryloxypropyl trimethoxysilane (MPTMS, Aldrich) and diphenylsilanediol (DPSD) are introduced at a molar ratio of 1.0:1.25. Next, barium hydroxide as a catalyst is added thereto in an amount of 0.1 mol % based on the silane, and the reaction mixture is allowed to react under agitation at 80° C. for 4 hours to obtain a resin whose siloxane bond-containing component has methacryl groups and phenyl groups. Then, 1,6-hexanediol diacrylate is added to the resultant resin in an amount of 20% based on the resin in order to adjust the refractive index of the resin to that of a glass filler and to improve the heat resistance. Additionally, 2,2-dimethoxy-2-phenylacetophenone (BDK, Aldrich) is added thereto as a photocuring catalyst in an amount of 2 wt % based on the resin. After that, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

Example 3

First, 3-methacryloxypropyl trimethoxysilane (MPTMS, Aldrich) and diphenylsilanediol (DPSD) are introduced into a 200 mL flask at a molar ratio of 1:1. Next, barium hydroxide is added thereto as a catalyst in an amount of 0.1 mol % based on the silane and the reaction mixture is agitated at 80° C. for 4 hours to perform a reaction, thereby providing a resin whose siloxane bond-containing component has methacryl groups and phenyl groups. Then, 1,6-hexanediol diacrylate is added to the resultant resin in an amount of 20% based on the resin. Additionally, 2,2-dimethoxy-2-phenylacetophenone (BDK, Aldrich) is added thereto as a photocuring catalyst in an amount of 2 wt % based on the resin. Further, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

Example 4

To a 200 mL flask, 3-methacryloxypropyl trimethoxysilane (MPTMS, Aldrich), titanium isopropoxide (Ti(O$^i$Pr)$_4$, Aldrich), acetylacetone (Aldrich) and diphenylsilanediol (DPSD) are introduced at a molar ratio of 1.2:0.8:0.8:3. Next, barium hydroxide as a catalyst is added thereto in an amount of 0.1 mol % based on the silane, and the reaction mixture is agitated at 80° C. for 72 hours. Then, propylene glycol methyl ether acetate (PGMEA, Aldrich) is added thereto, and the reaction mixture is allowed to react in a reduced pressure evaporator under 0.1 MPa at 60° C. for 30 minutes. Then, methanol and water remaining in the resin are removed to obtain a resin having a siloxane bond structure and titania bond structure and containing methacryl groups and phenyl groups on those structures forming heterometal bonds. After that, 1,6-hexanediol diacrylate is added to the resultant resin in an amount of 20% based on the resin. Additionally, 2,2-dimethoxy-2-phenylacetophenone (BDK, Aldrich) is added thereto as a photocuring catalyst in an amount of 2 wt % based on the resin. Further, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

Example 5

To a 200 mL flask, 2-(3,4-epoxycyclohexyl)ethyltrimethoxysilane (ECTMS, Aldrich) and diphenylsilanediol (DPSD) are introduced at a molar ratio of 2:3. Next, barium hydroxide as a catalyst is added thereto in an amount of 0.1 mol % based on the silane, and the reaction mixture is allowed to react under agitation at 80° C. for 72 hours. Then, propylene glycol methyl ether acetate (PGMEA, Aldrich) is added thereto, and the reaction mixture is allowed to react in a reduced pressure evaporator under 0.1 MPa at 60° C. for 30 minutes. Then, methanol remaining in the resin is removed to obtain a resin having epoxy groups and phenyl groups. After that, methyl hexahydrophthalic anhydride (MHHPA, Aldrich) is added to the resultant resin in an amount of 0.9 mols per equivalent of the resin and trioctylphosphine oxide (TOP, Aldrich) is further added thereto as a thermal curing catalyst in an amount of 8 mol % based on the anhydride. Further, glass fabric (E-glass) having a thickness of 50 μm is impregnated with the resultant resin, followed by thermal curing at 200° C. for 24 hours, and a transparent composite is fabricated in the form of a sheet having a thickness of 100 μm or less.

Comparative Example 5

To 24.638 g of 2-(3,4-epoxycyclohexyl)ethyl trimethoxysilane (ECTMS, Aldrich), 2.7 g of aqueous 0.1 N hydrochloric acid (HCl) solution is added for the purpose of catalysis and hydrolysis. Next, 100 wt % of propyleneglycol methyl ether acetate (PGMEA, Aldrich) is further added thereto based on the weight of MPTS as a solvent to perform a uniform reaction. The reaction mixture is introduced into a 200 mL flask and agitated at 80° C. for 48 hours under reflux to obtain a resin having cycloepoxy groups. The resultant solution is treated by a reduced pressure evaporator under −0.1 MPa at 60° C. for 30 minutes to remove methanol and water remaining in the resin. To the resultant resin, methylhexahydrophthalic anhydride (MHHPA, Aldrich) and trioctylphosphine oxide (TOP, Aldrich) are added each in an amount of 0.9 mols per epoxy equivalent and 8 mol % based on the added MHHPA for the purpose of curing and initiation. After that, glass fabric (E-glass) having a thickness of 50 μm is impregnated with the resultant composite resin composition, followed by thermal curing at 200° C. for 24 hours, and a transparent composite is fabricated in the form of a sheet having a thickness of 100 μm or less.

Example 6

To a 200 mL flask, 3-methacryloxypropyl trimethoxysilane (MPTMS, Aldrich) and diphenylsilanediol (DPSD) are introduced at a molar ratio of 2:3. Next, barium hydroxide as a catalyst is added thereto in an amount of 0.1 mol % based on the silane, and the reaction mixture is allowed to react under agitation at 80° C. for 4 hours to obtain a silane resin having methacryl groups and phenyl groups. Then, 2,2,3,3,3-pentafluoropropyl acrylate is added to the resultant resin in an amount of 10% based on the resin. Additionally, 2,2-dimethoxy-2-phenylacetophenone (BDK, Aldrich) is added thereto as a photocuring catalyst in an amount of 2 wt % based on the resin. After that, glass fabric (E-glass) having a thickness of 50 μm is impregnated with the resultant composite resin composition, followed by exposure to a UV lamp with a wavelength of 365 nm under nitrogen atmosphere for 5 minutes, thereby inducing photocuring. After the photocuring, additional curing is performed at 200° C. for 4 hours, and a transparent composite is fabricated in the form of a sheet having a thickness of about 100 μm.

*Test Method*

The samples obtained from Examples are evaluated for their physical properties, and the results are shown in Table 1.

1. Transmission

The transmission of each sample is determined at a wavelength of 550 nm using a UV/VIS/NIR spectrometer, UV-3101PC, available from Shimadzu Corporation.

2. Heat Resistance

While each sample is heated to 600° C. at a heating rate of 5° C./minute under nitrogen atmosphere using thermogravimetric analyzer Q-50 available from TA Instrument, the temperature ($T_{5\% \, mass \, loss}$) at which point the weight of the sample is decreased by 5% based on the original weight is determined.

3. Thermal Expansion Coefficient

While each sample is heated to 225° C. at a heating rate of 5° C./minute under nitrogen atmosphere using thermomechanical analyzer Extar 6100 available from Seiko Instrument, the thermal expansion coefficient is measured in a range of 50-150° C. Herein, a load of 100 mN and a frequency of 0.035 Hz are used.

TABLE 1

Physical Properties of Transparent Composites of Examples

| | Comp. Ex. 1 | Ex. 1 | Ex. 2 | Ex. 3 | Ex. 4 | Ex. 5 | Comp. Ex. 5 | Ex. 6 |
|---|---|---|---|---|---|---|---|---|
| Thickness (mm) | 0.059 | 0.064 | 0.071 | 0.085 | 0.096 | 0.073 | 0.089 | 0.091 |
| Transmission (%) 550 nm | 87 | 79 | 86 | 86 | 82 | 89 | 85 | 84 |
| Heat Resistance (° C.) | 274 | 250 | 272 | 268 | 269 | 300 | 287 | 266 |
| Thermal Expansion Coefficient (ppm/° C.) | 12 | 34 | 14 | 18 | 22 | 15 | 23 | 19 |

While the present invention has been described with respect to the specific embodiments, it will be apparent to those skilled in the art that various changes and modifications may be made without departing from the spirit and scope of the invention as defined in the following claims.

What is claimed is:

1. A transparent composite comprising:
    a transparent crosslinked siloxane resin produced by non-hydrolytic condensation, wherein the transparent crosslinked siloxane resin is at least one resin selected from the group consisting of: (1) a resin having Si—O (siloxane) bonds produced by non-hydrolytic condensation of reactants containing organoalkoxysilane and organosilanediol; (2) a resin having at least two kinds of heterometal bonds, including Si—O (siloxane) bonds, produced by non-hydrolytic condensation of reactants containing a mixture of organoalkoxysilane with metal alkoxide, and organosilanediol; and (3) a resin produced by non-hydrolytic condensation of reactants containing the above reactants and a reactive additive; and
    a glass fabric,
    wherein the glass fabric is impregnated with the transparent siloxane resin,
    wherein a difference in refractive indices between the siloxane resin and the glass fabric is 0.01 or less, and
    wherein the transparent composite has a transmission of 80% to 100% to light with a wavelength of 550 nm, and a thermal expansion coefficient of 30 ppm/° C. or less at a temperature of about 30° C. to about 200° C., and wherein the transparent composite is directed to providing a substrate for thin film transistor (TFT) devices, display devices or optical devices.

2. The transparent composite according to claim 1, wherein the organoalkoxysilane is selected from the group consisting of: 3-glycidoxypropyltrimethoxysilane, 3-glycidoxypropyltriethoxysilane, 2-(3,4-epoxycyclohexyl)ethyl trimethoxysilane, 2-(3,4-epoxycyclohexyl)ethyltriethoxysilane, methyltrimethoxysilane, methyltriethoxysilane, methyl tripropoxysilane, propylethyltrimethoxysilane, ethyltriethoxy silane, vinyltrimethoxysilane, vinyltriethoxysilane, vinyltripropoxysilane, phenyltrimethoxysilane, N-(3-acryloxy-2-hydroxypropyl)-3-aminopropyltriethoxysilane, N-(3-acryloxy-2-hydroxypropyl)-3-aminopropyltrimethoxysilane, N-(3-acryloxy-2-hydroxypropyl)-3-aminopropyltripropoxysilane, 3-acryloxypropylmethylbis(trimethoxy)silane, 3-acryloxypropyl trimethoxysilane, 3-acryloxypropyltriethoxysilane, 3-acryloxy propyltripropoxysilane, 3-(meth)acryloxypropyltrimethoxysilane, 3-(meth)acryloxypropyltriethoxysilane, 3-(meth)acryloxy propyltripropoxysilane, N-(aminoethyl-3-aminopropyl)trimethoxy silane, N-(2-aminoethyl-3-aminopropyl)triethoxysilane, 3-aminopropyltrimethoxysilane, 3-aminopropyltriethoxysilane, chloropropyltrimethoxysilane, chloropropyltriethoxysilane, heptadecafluorodecyltrimethoxysilane and a combination thereof.

3. The transparent composite according to claim 1, wherein the organosilanediol is selected from the group consisting of diphenylsilanediol, diisobutylsilanediol and a combination thereof.

4. The transparent composite according to claim 1, wherein the metal alkoxide is selected from the group consisting of: a metal alkoxide selected from the group consisting of tetraethyl orthosilicate, tetramethyl orthosilicate, aluminum ethoxide, tantalum ethoxide, germanium ethoxide, titanium ethoxide, zirconium ethoxide, zirconium propoxide, titanium propoxide, aluminum isopropoxide, germanium isopropoxide, titanium isopropoxide, zirconium isopropoxide, aluminum tributoxide, tantalum butoxide, aluminum t-butoxide, titanium butoxide, titanium t-butoxide, zirconium butoxide, zirconium t-butoxide, tin tetramethoxide, tin tetraethoxide, tin tetrapropoxide, tin tetrabutoxide and mixtures thereof; complexes of the metal alkoxides with diketone or ketoester; and combinations thereof.

5. The transparent composite according to claim 1, wherein the crosslinkable reactive group is at least one selected from acryl, methacryl, vinyl, epoxy, amino and hydroxyl groups.

6. The transparent composite according to claim 1, wherein the reactive additive is at least one selected from the group consisting of: (meth)acrylic monomers, including ethylene glycol diacrylate, ethylene glycol dimethacrylate, 1,4-butanediol diacrylate, 1,6-hexanediol diacrylate, 2-phenoxyethyl acrylate, urethane acrylate, bisphenol A ethoxylate diacrylate, pentaerythritol tetraacrylate, trimethylolpropyl triacrylate, polyethyleneglycol diacrylate, pentabromobenzyl acrylate, pentabromobenzyl methacrylate, pentabromophenyl acrylate, pentabromophenyl methacrylate, zirconium acrylate, 2,4,6-tribromophenyl methacrylate, poly(2,4,6-tribromophenyl methacrylate), poly(1-naphthyl methacrylate), 2,2,3,3,3-pentafluoropropyl acrylate, 2,2,3,4,4,4-hexafluorobutyl acrylate, and poly(1,1,1,3,3,3-hexafluoroisopropyl acrylate); and the epoxy monomer is at least one selected from epoxy group-containing hydrogenated biphenyl type alicyclic epoxy resins, and oxetanyl group-containing epoxy resins.

7. The transparent composite according to claim 1, wherein the transparent crosslinked siloxane resin is obtained using a thermal curing catalyst or photocuring catalyst.

* * * * *